(12) United States Patent
Yamamoto (10) Patent No.: US 6,559,533 B1
(45) Date of Patent: May 6, 2003

(54) HIGH-FREQUENCY PACKAGE AND THE METHOD FOR MANUFACTURING THE SAME

(75) Inventor: Fumio Yamamoto, Tochigi-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 20 days.

(21) Appl. No.: 09/662,702

(22) Filed: Sep. 15, 2000

(30) Foreign Application Priority Data

Sep. 17, 1999 (JP) .......................................... 11-263702
Aug. 18, 2000 (JP) ........................................ 2000-248482

(51) Int. Cl.[7] .......................... H01L 23/15; H01L 23/34; H01L 23/06
(52) U.S. Cl. ...................................................... 257/705
(58) Field of Search ................................. 257/705, 706, 257/713, 720, 684, 729, 781

(56) References Cited

U.S. PATENT DOCUMENTS 3,766,634 A    10/1973   Babcock et al. ............ 29/471.9
4,150,393 A  * 4/1979   Wilson et al. ................ 257/700
6,232,657 B1 * 5/2001   Komorita et al. ............ 257/700

FOREIGN PATENT DOCUMENTS

JP  62-66650   * 3/1987 ........... H01L/23/04
JP  63-239964  * 10/1988 ................. 257/705

* cited by examiner

Primary Examiner—Jasmine J B Clark
(74) Attorney, Agent, or Firm—Oblon, Spivak, McClelland, Maier & Neustadt, P.C.

(57) ABSTRACT

The high-frequency package according to the present invention has a base plate made of copper; a ceramic frame having a space for accommodating a circuit device and mounted on the base plate; and a pattern of circuits developed on the ceramic frame. The base plate and the ceramic frame, and the ceramic frame and the patterned circuits, are both joined together by a DBC technique. According to the present invention, the high-frequency package can be fabricated by a simpler procedure.

19 Claims, 6 Drawing Sheets

HIGH-FREQUENCY PACKAGE AND THE METHOD FOR MANUFACTURING THE SAME

CROSS REFERENCE TO RELATED APPLICATIONS

The subject application is related to subject matter disclosed in the Japanese Patent Application No.Hei11-263702 filed in Sep. 17, 1999 in Japan, to which the subject application claims priority under the Paris Convention and which is incorporated by reference-herein.

BACKGROUND OF THE INVENTION

1. Field of the Invention

The present invention relates to a high-frequency package for encapsulating a circuit device having a microwave circuit or the like, and the manufacturing method thereof.

2. Description of the Related Art

A microwave circuit for amplifying a high-frequency signal of microwave or the like comprises commonly semiconductor devices such as field-effect transistors and circuit devices including capacitors and resistors. The semiconductor devices and the circuit devices are air-tightly encapsulated in a high-frequency package.

Such a high-frequency package comprises a ceramic frame having an inner space for accommodating the semiconductor devices and the circuit devices and such as a base plate on which the ceramic frame is placed. A pattern of circuits for transmitting signals are provided on the ceramic frame.

A method for manufacturing such a high-frequency package includes applying a dose of paste, for example, tungsten paste, onto the ceramic frame made of a ceramic material such as alumina and baking the paste together with the ceramic frame to form the patterned circuits. This is followed by bonding the ceramic frame to the base plate and leads to the circuit pattern on the ceramic frame by means of silver brazing.

In the method of manufacturing a convention high-frequency package, the pattern of circuits are baked and then the bonding between the ceramic frames and the base plate and between the patterned circuits and the leads is carried out by brazing. The method hence has the following technical disadvantages.

A conventional method for manufacturing a high-frequency package includes a baking step and two joining steps for developing circuit patterns and its overall procedure will hardly be facilitated.

Also, the joining is implemented by a brazing technique which requires particular jigs for supporting work pieces to be joined and its apparatus will be intricate.

SUMMARY OF THE INVENTION

It is an object of the present invention to provide a high-frequency package which can eliminate the above technical disadvantages and be fabricated by a simpler procedure.

It is another object of the present invention to provide the high-frequency package manufacturing method which can make the manufacturing process more simple and ease.

The high-frequency package according to the present invention comprises a base plate made of copper; a ceramic frame having a space for accommodating a circuit device and mounted on the base plate; and a pattern of circuits developed on the ceramic frame, wherein the base plate and the ceramic frame, the ceramic frame and the patterned circuits are both joined together by a DBC technique.

According to this package, the high-frequency package can thus be fabricated by a simpler procedure.

The high-frequency package manufacturing method according to the present invention comprises the steps of: the first step of mounting a ceramic frame, having a space for accommodating a circuit device, on the base plate made of copper; the second step of arranging the lead members for circuit pattern on the ceramic frame; the third step of bonding the base plate to the ceramic frame and the ceramic frame to the lead members at one time by a DBC technique.

According to this method, it is possible to make the high-frequency package manufacturing process simple and ease.

Other and further objects and features of the present invention will become obvious upon understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE PREFERRED EMBODIMENTS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

FIRST EMBODIMENT

A high-frequency package according to an embodiment of the present invention will be described with reference to FIG. 1.

Figure 1:
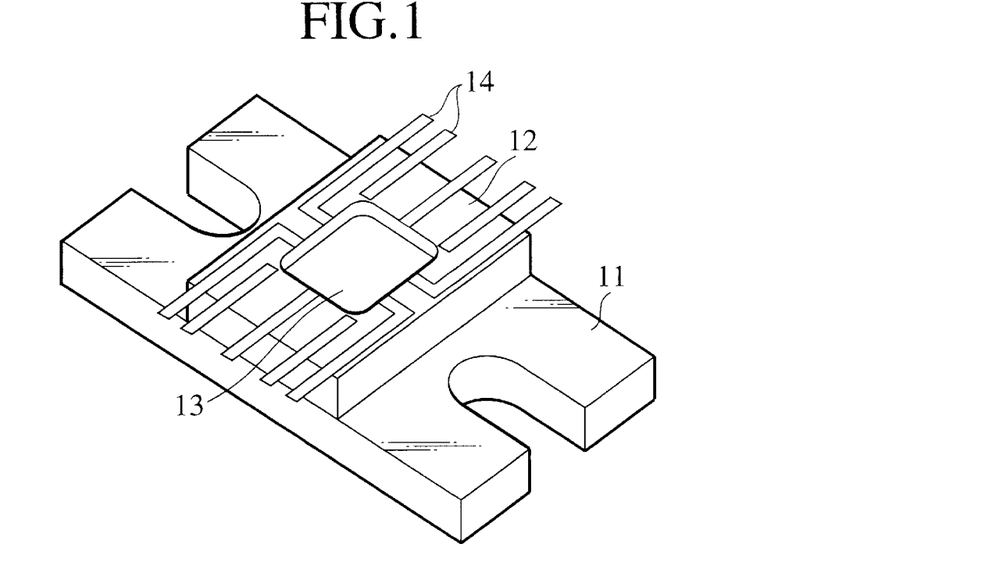
FIG. 1 is a perspective view of an arrangement of a high-frequency package according to the embodiment of the present invention.

As shown in FIG. 1, the high-frequency package according to the embodiment of the present invention consists mainly of a base plate 11 made of Cu and a ceramic frame 12 made of a ceramic material such as alumina and disposed on the center of the base plate 11.

The ceramic frame 12 has a through hole provided in the center thereof where a space 13 carrying a circuit device is accommodated.

Provided on the ceramic frame 12 are a pattern of circuits for transmitting signals to and from the circuit device (not shown) installed in the space 13 and a plurality of lead members 14, each made of Cu connected at one end to the patterned circuits and projected at the other end outwardly from the ceramic frame 12.

A method for manufacturing the high-frequency package according to an embodiment of the present invention will be described.

The method for manufacturing the high-frequency package starts with placing the ceramic frame 12 on the base plate 11 and arranging the lead members 14 on the ceramic frame 12. Then, their assembly is placed and heated under an $N_2$ atmosphere in a furnace to bonding at one time the base plate 11 to the ceramic frame 12 and the ceramic frame 12 to the lead members 14 by a DBC (direct bond copper) technique (Ref: U.S. Pat. No. 3,766,634).

According to this method, the base plate 11 and the ceramic frame 12 are bonded to each other while the ceramic frame 12 is bonded to the lead members 14 at the same time, whereby its overall procedure can be simplified.

Also, as the patterned circuits developed on the ceramic frame 12 and the lead members 14 connected to the patterned circuits are arrayed integral with each other, a step for joining the patterned circuits with the lead members, which is separately carried out in the prior art can thus be eliminated and the overall procedure will be simplified. The lead members 14 may simply be pre-bonded by an organic adhesive with no use of particular jigs, thus contributing to the simplification of the fabricating apparatus.

In the DBC technique, the bonding is conducted at a temperature of about 1000° C., and thereafter cool it down slowly. This increases the buffering effect of Cu, hence preventing breakage of the semiconductor devices, such as GaAs field-effect transistors, mounted on the base plate 11. In addition, since the ductility of Cu is increased, any deflection of the base plate 11 which may possibly occur can readily be corrected after the production. Moreover, the DBC technique permits the use of tough-pitch copper as Cu for the base plate 11, hence lowering the production cost and improving the thermal conductivity of the high-frequency package.

OTHER EMBODIMENTS

Various modifications will become possible for those skilled in the art after receiving the teachings of the present disclosure without depending from the scope thereof.

Figure 2:
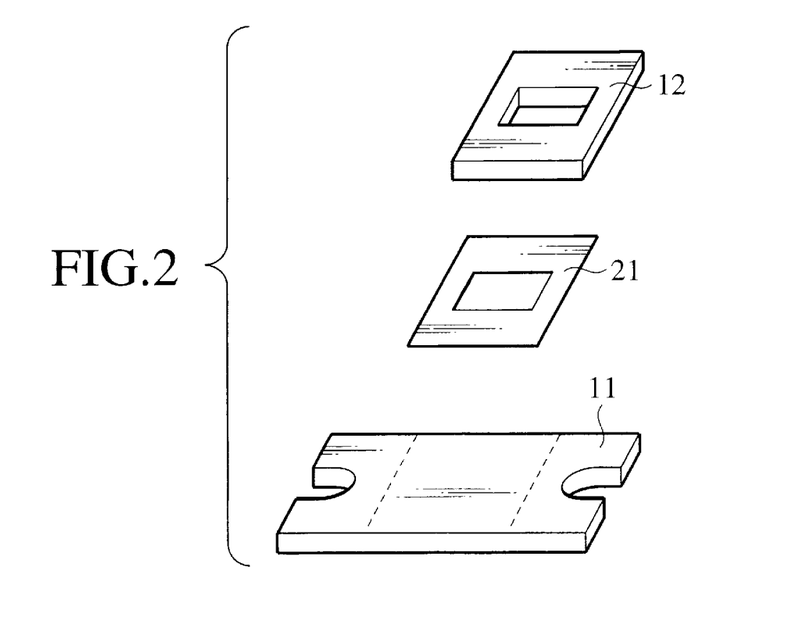
FIG. 2 is a perspective view of an arrangement of a high-frequency package according to another embodiment of the present invention.

As shown in FIG. 2, a high-frequency package according to another embodiment of the present invention includes a buffering Cu foil 21 which has a through opening provided in the center thereof and is disposed throughout a bonding area between the base plate 11 and the ceramic frame 12.

When the DBC technique is used for the bonding, a significant deflection may possibly result from a difference in the thermal expansion between Cu of the base plate 11 and a ceramic material of the ceramic frame 12 or a difference in the thickness between the base plate 11 and the ceramic frame 12. That deflection can be avoided by the presence of the Cu foil 21 which acts as a buffering member. Also, the Cu foil 21 can positively prevent breakage of the ceramic frame 12.

Figure 3:
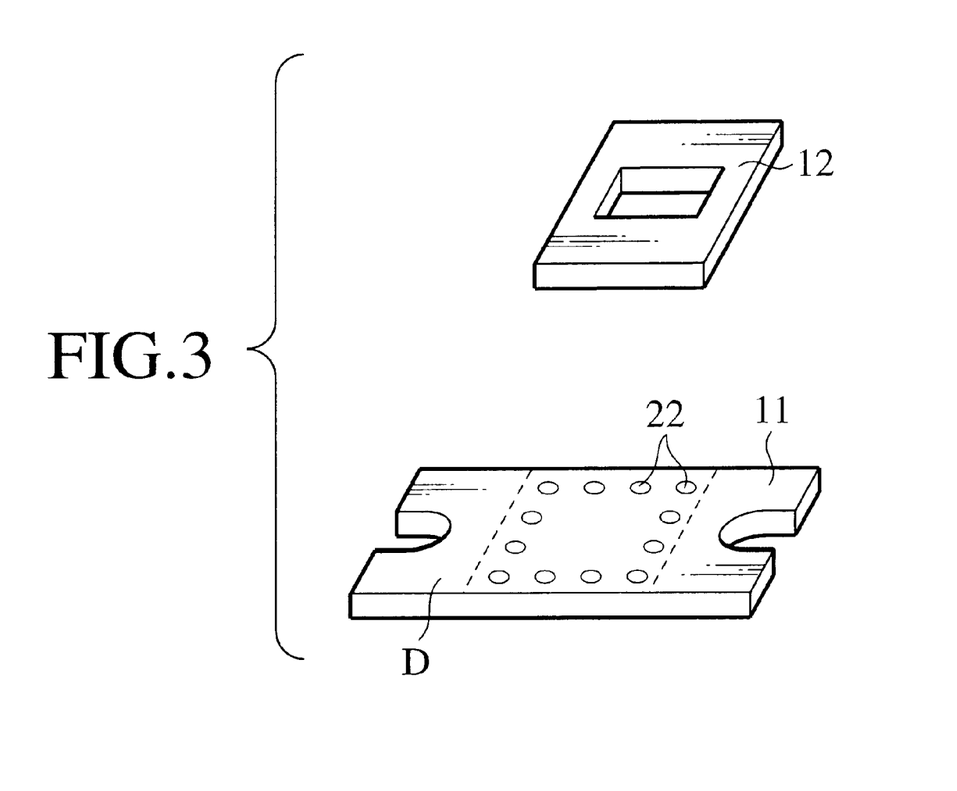
FIG. 3 is a perspective view of an arrangement of a high-frequency package according to a further embodiment of the present invention.

In a high-frequency package according to a further embodiment of the present invention shown in FIG. 3, the base plate 11 has a plurality of through apertures 22 provided in a bonding area thereof, denoted by the dotted strip D, to which the ceramic frame 12 is bonded. The through apertures 22 reduce the bonding area between the base plate 11 and the ceramic frame 12, hence preventing possible deflection and breakage.

Figure 4:
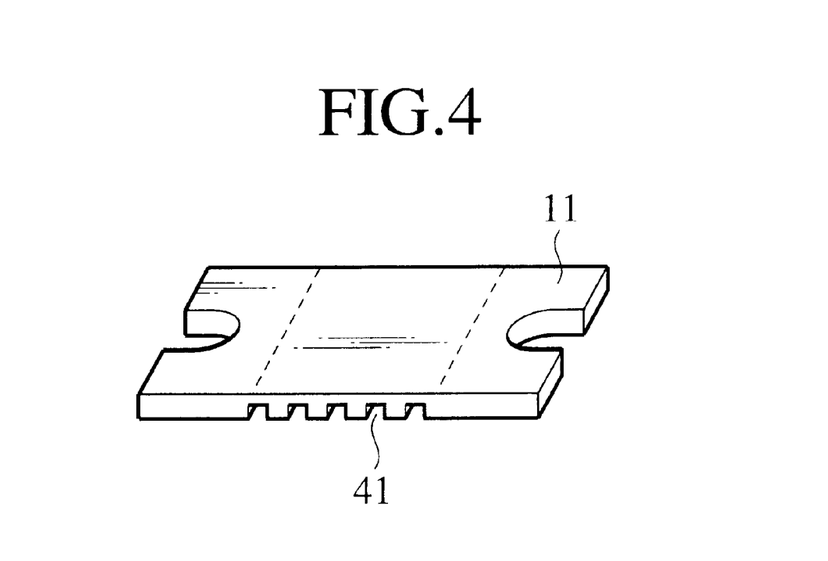
FIG. 4 is a perspective view of an arrangement of a high-frequency package according to a further embodiment of the present invention.

The through apertures 22, in the high-frequency package of the another embodiment of the present invention shown in FIG. 3, which are provided in the bonding area of the base plate 11 to which the ceramic frame 12 is bonded may be replaced by a group of grooves or recesses 41 provided in the lower side of the base plate 11. The recesses 41 permit the base plate 11 to be not uniform in the thickness and can thus offset deflections generated by thermal distortion due to a difference in the thermal expansion between base plate 11 and the ceramic frame 12, minimizing unwanted bimetal effects.

A further embodiment of the present invention will now be described with reference to FIG. 5.

Figures 5A, 5B, 5C, 5D:
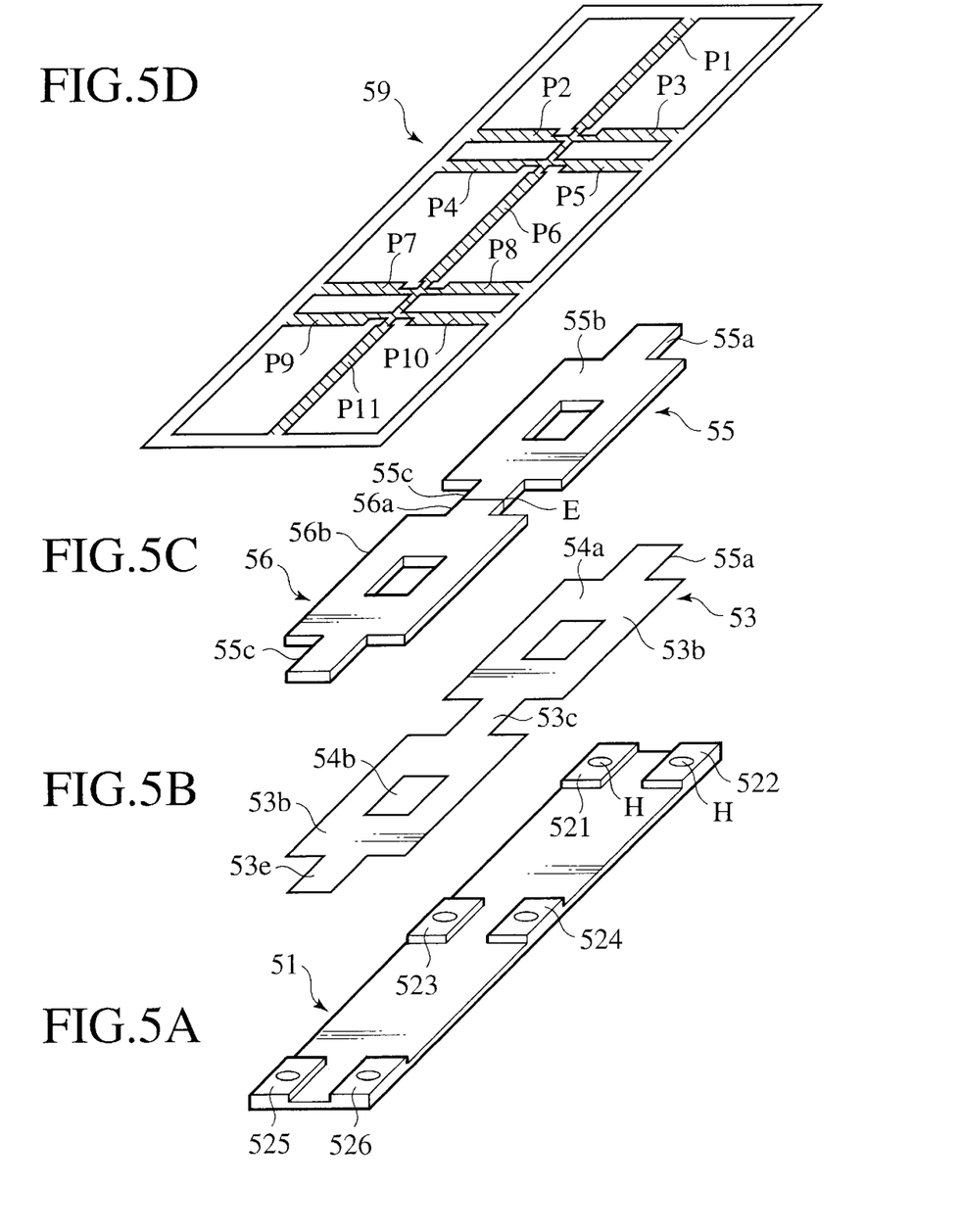
FIG. 5 is a perspective view of an arrangement of a high-frequency package according to another embodiment of the present invention.

FIG. 5A illustrates a base plate 51 of a rectangular shape having six rectangular raised portions 521 to 526 provided on the four corners thereof and on a central region thereof at two side edges. Each of the raised portions 521 to 526 has a mounting hole H therein.

FIG. 5B illustrates a thin copper sheet 53 which serves as a buffering member bonded on the base plate 51 and is substantially equal to the base plate 51 in the size, particularly the length and the width. The copper sheet 53 is formed to such a shape as eliminating the raised portions 521 to 526 of the base plate 51. More particularly, the shape consists of a first extending portion 53a corresponding to a region of the base plate 51 defined between the two raised portions 521 and 522, a first wide portions 53b corresponding to a region defined between the two raised portions 521, 522 and the two raised portions 523, 524 at the center, a joint portion 53c corresponding to a region defined between the two raised portions 523 and 524, a second wide portions 53d corresponding to a region defined between the two raised portions 523, 524 at the center and the two raised portions 525, 256, and a second extending portion 53e corresponding to a region defined between the two raised portions 525 and 526.

FIG. 5C illustrates a couple of first and second ceramic frames 55 and 56 bonded on the copper sheet 53. The two ceramic frames 55 and 56 are identical in the shape and their joined size is substantially identical to the shape of the copper sheet 53. The ceramic frame 55 or 56 includes a first extending portion 55a or 56a, a wide portion 55b or 56b, a second extending portion 55c or 56c, and an opening 57 or 58 provided in the wide portion 55b or 56b. The second extending portion 55c of the first ceramic frame 55 is abutted at the edge line E to the second extending portion 56c of the second ceramic frame 56.

FIG. 5D illustrates a patterned circuits conductor made of copper and bonded on the two ceramic frames 55 and 56. The conductor includes band-like strips p1 to p11 (denoted by the hatching) which are laid as the pattern of circuits on the ceramic frames 55 and 56 or as the lead members consisted of, in a combination, a pattern of circuits and leads extended outwardly of the ceramic frames 55 and 56. The strips p1 to p11 are joined together by dummy strips (denoted by the blank), constituting an array of endless loops.

Joint regions of the band-like strips in the patterned circuits between p1, p2, and p3, between p4, p5, and p6, between p6, p7, and p8, and between p9, p10, and p11 are narrowed in the width. In addition, a notch c is provided a boundary region of the band-like strip between the normal region and the narrow region by cutting perpendicular to the lengthwise direction.

The method starts with placing the copper sheet 53 on the base plate 51. More specifically, the copper sheet 53 is positioned so that its first extending portion 53a, the joint portion 53c, and the second extending portion 54e sit between the two raised portions 521 and 522, between the two raised portions 523 and 524, and between the two raised portions 525 and 526 respectively on the base plate 51.

Then, the two ceramic frames 55 and 56 are placed on the copper sheet 53. More particularly, as the combined size of the two ceramic frames 55 and 56 is substantially equal to that of the copper sheet 53, the two frames can simply be placed over the copper sheets 53.

Next, the patterned circuits conductor 59 is placed on the two ceramic frames 55 and 56. More specifically, the conductor 59 is positioned with its notches c aligned with the edge of the openings 57 and 58 of the ceramic frames 55 and 56.

The assembly of the patterned circuits conductor 59, the two ceramic frames 55 and 56, the copper sheet 53, and the base plate 51 layered in this order is then heated so that the patterned circuits conductor 59 is bonded to the two ceramic frames 55 and 56, the two ceramic frames 55 and 56 are bonded to the copper sheet 53, and the copper sheet 53 is bonded to the base plate 51 by the DBC bonding technique.

This is followed by trimming the patterned circuits conductor 59 to shape the patterned circuits strips p1 to p11. As a result, a high-frequency package shown in FIG. 6 or 7 is completed.

Figure 6:
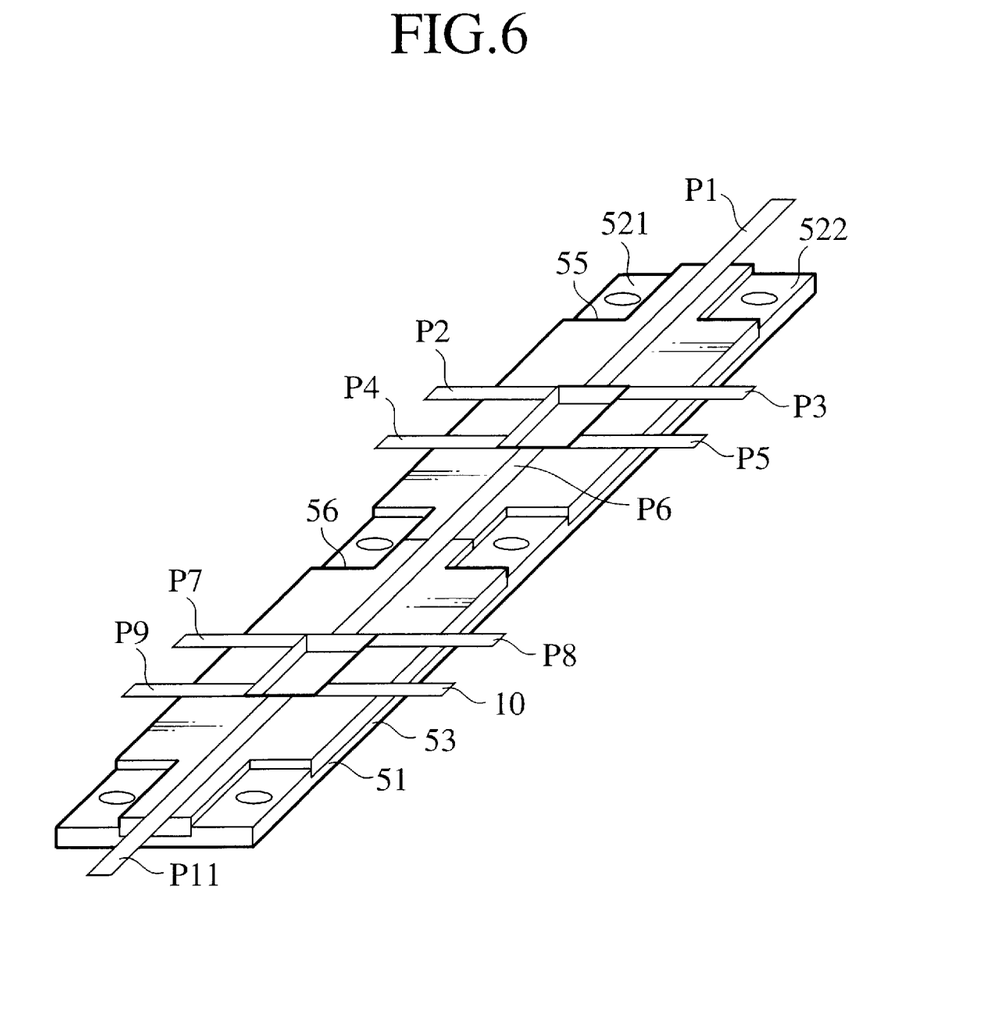
FIG. 6 is a perspective view of an arrangement of a high-frequency package according to a further embodiment of the present invention.

The high-frequency package shown in FIG. 6 allows the two ceramic frames 55 and 56 abutted to each other along their long edges. This causes the patterned circuits strips to extend through the centers of the two ceramic frames 55 and 56 or are aligned along the lengthwise direction where high-frequency signals are transmitted through the two ceramic frames 55 and 56. The high-frequency package shown in FIG. 7 permits the two patterned circuits strips of the ceramic frames 55 and 56 to extend in parallel with each other for transmitting high-frequency signals. The patterned circuits strips shown in FIG. 7 are denoted by the letter p.

Figure 7:
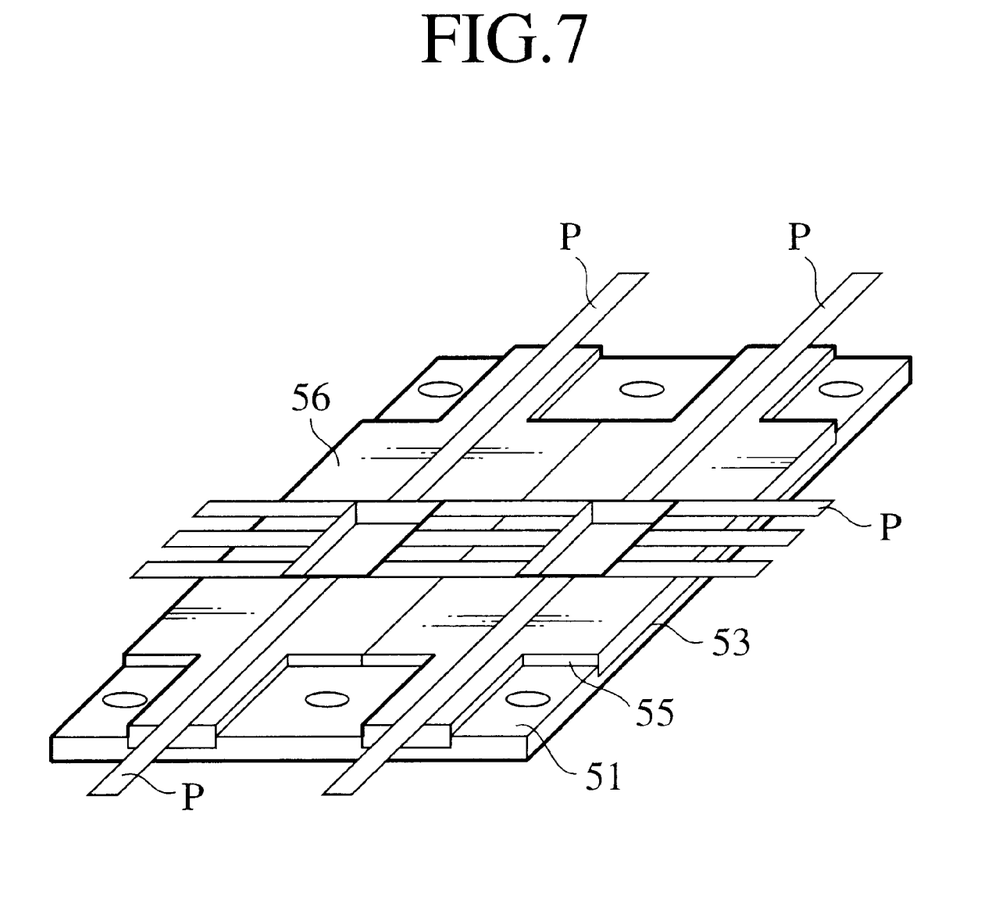
FIG. 7 is a perspective view of an arrangement of a high-frequency package according to a further embodiment of the present invention.

The base plate 51 used in the high-frequency packages shown in FIGS. 5 to 7 are fabricated by common pressing or etching process and temporarily bonded at its upper surface with the two ceramic frames 55 and 56 via the copper sheet 53 fabricated by also pressing or etching process. The DBC bonding is then carried out after the patterned circuits conductor 59 fabricated by common pressing or etching process is placed on the previous assembly.

Since the base plate 51 and the two ceramic frames 55 and 56 are properly sized to have such thicknesses that they can hardly be injured or broken by a difference in the thermal expansion between their two different materials, unless receiving an excessive force from the outside.

As the patterned circuits conductor 59 and the ceramic frames 55 and 56 are joined together by the DBC bonding technique, normal expansion or shrinkage of the ceramic frames 55 and 56 may hardly injure the patterned circuits conductor 59 by its thermal expansion difference. Also, the patterned circuits conductor 59 and the base plate 51 which is a base conductor are made of copper as well as the copper sheet 53, hence contributing to the improved thermal and electrical characteristics of the package. For example, desired levels of the microwave or milliwave characteristics can be obtained by adjusting the ceramic frames 55 and 56 to a corresponding thickness.

When the ceramic frames 55 and 56 are so sized as not to be injured by a difference in the thermal expansion from the base plate 51, they may rarely be broken even with its total number increased. This contributes to the large capacity of the high-frequency package and hence allows a microwave circuit to be constructed by a less number of the high-frequency packages.

While the ceramic frames are plural, the base plate is a single unit hence ensuring a higher level of the thermal or electrical characteristics. Also, as the patterned circuits are arrayed to a single conductor, a cover region of the high-frequency package can be formed integral thus reducing the overall number of relevant components. The patterned circuits strips are simultaneously positioned as a single array and their separate positioning steps will be eliminated.

While the foregoing embodiments of the present invention are based on the base plate made of copper, the copper means any copper contained metal material such as a copper alloy or a copper composite material. Also, the ceramic frames on the base plate are not limited to two but may be used three or more. In the high-frequency packages shown in FIGS. 5 to 7, the base plate may have apertures or recesses provided in the bonding area thereof with the ceramic frames.

Figure 8:
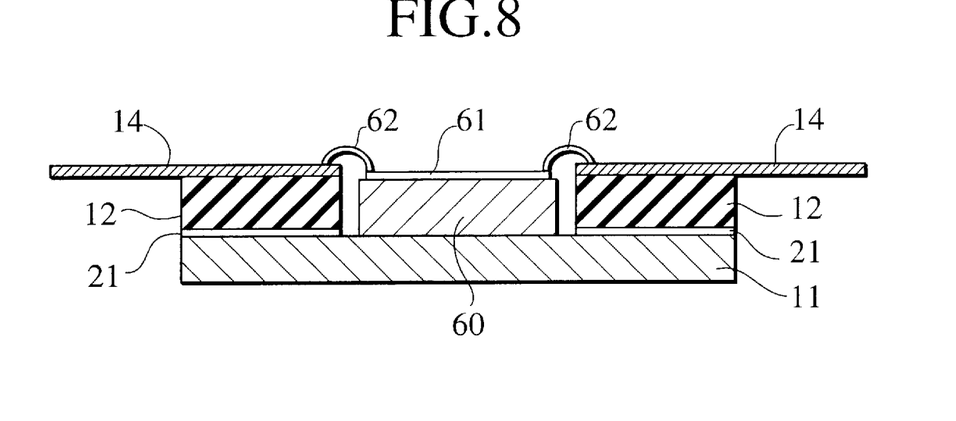
FIG. 8 is a perspective view of an arrangement of a high-frequency package according to a further embodiment of the present invention.
Figure 9:
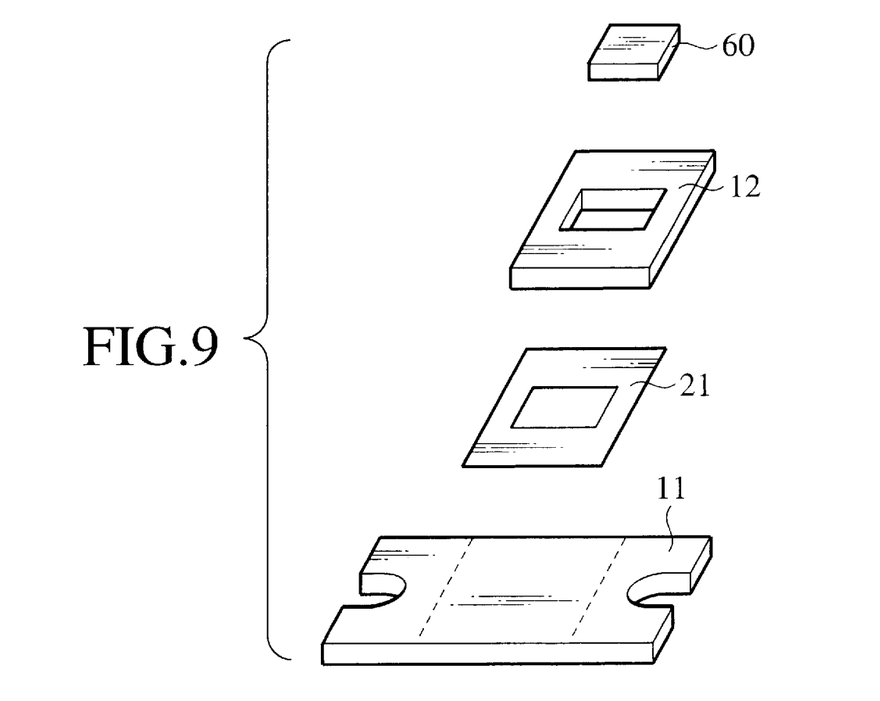
FIG. 9 is a perspective view of an arrangement of a high-frequency package according to a further embodiment of the present invention.

As shown in FIG. 8 and FIG. 9, it is desirable to mount a pedestal element on the base plate and provide a circuit device on the pedestal element in the space of the ceramic frame. In the micro-wave application, the increasing reactance of the wire reactance leads to the impedance mismatching. According to this other embodiment, the length of wire, which connects the circuit device and lead members, can be shorten and this impedance mismatching can be avoided.

It is understood that the present invention may cover any other appropriate modifications than those described above. The technical scope of the present invention shall be limited only by the teachings of the following claims.

What is claimed is:

1. A high-frequency package comprising:
   a base plate made of copper;
   a thin copper sheet disposed on the base plate and joined with the base plate by a DBC (direct bond copper) technique;
   a ceramic frame having a space for accommodating a circuit device, the ceramic frame being mounted on the thin copper sheet and joined with the thin copper sheet by the DBC technique; and
   a pattern of circuits developed on the ceramic frame and joined together with the ceramic frame by the DBC technique.

2. The high-frequency package of claim 1, further comprising:
   a pedestal element mounted on the base plate in the space of the ceramic frame.

3. The high-frequency package of claim 1, wherein the base plate has through apertures provided in the bonding area thereof with the ceramic frame.

4. The high-frequency package of claim 1, wherein the base plate has recesses provided in the bonding area thereof with the ceramic frame.

5. A high-frequency package comprising:

a base plate made of copper;

a ceramic frame having a space for accommodating a circuit device, the ceramic frame being mounted on the base plate and joined with the base plate by a DBC (direct bond copper) technique;

a pattern of circuits developed on the ceramic frame and joined together with the ceramic frame by the DBC technique; and lead members connected to the patterned circuits, assembled to a lead array with the patterned circuits and extending outwardly at the end from the ceramic frame.

6. The high-frequency package of claim 2, further comprising:

a thin copper sheet sandwiched at a bonding between the base plate and the ceramic frame.

7. The high-frequency package of claim 5, further comprising:

a pedestal element mounted on the base plate in the space of the ceramic frame.

8. The high-frequency package of claim 5, wherein the base plate has through apertures provided in the bonding area thereof with the ceramic frame.

9. The high-frequency package of claim 5, wherein the base plate has recesses provided in the bonding area thereof with the ceramic frame.

10. A high-frequency package comprising:

a base plate made of copper;

a thin copper sheet disposed on the base plate and joined with the base plate by a DBC (direct bond copper) technique;

a plurality of ceramic frames, each having a space for accommodating a circuit device, the ceramic frames being mounted on the thin copper sheet and joined together with the thin copper sheet by the DBC technique; and a pattern of circuits developed on the ceramic frame and joined together with the ceramic frames by the DBC technique.

11. The high-frequency package of claim 10, wherein portions of the patterned circuits are integrally bridged over the plurality of the ceramic frames.

12. The high-frequency package of claim 10, further comprising:

a pedestal element mounted on the base plate in the space of the ceramic frame.

13. The high-frequency package of claim 10, wherein the base plate has through apertures provided in the bonding area thereof with the ceramic frame.

14. The high-frequency package of claim 10, wherein the base plate has recesses provided in the bonding area thereof with the ceramic frame.

15. A high-frequency package comprising:

a base plate made of copper;

a plurality of ceramic frames, at least one of the ceramic frames having a space for accommodating a circuit device and being mounted on the base plate;

a pattern of circuits developed on the ceramic frame; and lead members connected to at least one patterned circuit and extended outwardly at the end from the ceramic frame, wherein:

at least one patterned circuit and the lead members are assembled to a lead array, and the base plate and the plurality of ceramic frames, and the plurality of ceramic frames and the lead array, are both joined together by a DBC (direct bond copper) technique.

16. The high-frequency package of claim 15, wherein portions of the patterned circuits are integrally bridged over the plurality of the ceramic frames.

17. The high-frequency package of claim 15, further comprising:

a pedestal element mounted on the base plate in the space of the ceramic frame.

18. The high-frequency package of claim 15, wherein the base plate has through apertures provided in the bonding area hereof with the ceramic frame.

19. The high-frequency package of claim 15, wherein the base plate has recesses provided in the bonding area thereof with the ceramic frame.

* * * * *